US008793631B2

(12) United States Patent
Wu et al.

(10) Patent No.: US 8,793,631 B2
(45) Date of Patent: Jul. 29, 2014

(54) COMPUTING DEVICE AND METHOD FOR AUTOMATICALLY CHECKING WIRING INFORMATION

(71) Applicant: Hon Hai Precision Industry Co., Ltd., New Taipei (TW)

(72) Inventors: Dan-Chen Wu, New Taipei (TW); Chun-Jen Chen, New Taipei (TW); Ying Tso, New Taipei (TW)

(73) Assignee: Hon Hai Precision Industry Co., Ltd., New Taipei (TW)

(*) Notice: Subject to any disclaimer, the term of this patent is extended or adjusted under 35 U.S.C. 154(b) by 0 days.

(21) Appl. No.: 13/928,797

(22) Filed: Jun. 27, 2013

(65) Prior Publication Data
US 2014/0026109 A1 Jan. 23, 2014

(30) Foreign Application Priority Data
Jul. 18, 2012 (CN) .......................... 2012 1 2486689

(51) Int. Cl.
G06F 17/50 (2006.01)
(52) U.S. Cl.
USPC .......................................... 716/112

(58) Field of Classification Search
CPC .................................................... G06F 17/5081
USPC .......................................... 716/112
See application file for complete search history.

(56) References Cited

U.S. PATENT DOCUMENTS 6,349,402 B1 * 2/2002 Lin ................................ 716/113
6,889,367 B1 * 5/2005 Frank et al. .................... 716/112
6,976,236 B1 * 12/2005 Tain et al. ...................... 716/126
2005/0246671 A1 * 11/2005 Bois et al. .......................... 716/5
2006/0158280 A1 * 7/2006 Jow et al. ......................... 333/33
2006/0284697 A1 * 12/2006 Lin et al. ........................... 333/4

* cited by examiner

Primary Examiner — Jack Chiang
Assistant Examiner — Brandon Bowers
(74) Attorney, Agent, or Firm — Novak Druce Connolly Bove + Quigg LLP

(57) ABSTRACT

In a computing device, a computerized method and a non-transitory storage medium are applied in checking whether the transmission lines in a stored wiring diagram meet a certain criterion in relation to vias in the routes of differential pairs. A transmission line is selected to determine whether or not the line belongs to a differential pair and passes through at least one via. Another transmission line of the differential pair is obtained for analysis when the selected transmission line passes through at least one via. Sizes of vias in the respective routes of the differential pair are compared and a distance between the vias of the differential pair is compared. The differential pair, and the sizes of vias which comply or do not comply with the criterion are recorded and displayed in a list of results.

15 Claims, 3 Drawing Sheets

COMPUTING DEVICE AND METHOD FOR AUTOMATICALLY CHECKING WIRING INFORMATION

BACKGROUND

1. Technical Field

Embodiments of the present disclosure relate to wiring design, and more particularly to a computing device and a method for automatically checking wiring design information.

2. Description of Related Art

Differential signaling is a method of transmitting information electrically with two complementary signals carried on two wires, called a differential pair. Differential pairs are usually found on a printed circuit board (PCB), in cables (twisted-pair cables, ribbon cables), and in connectors. Since external interferences tend to affect both wires together, and data is represented only by the difference between the wires, the technique improves resistance to electromagnetic noise compared with use of only one wire and an un-paired reference (such as ground).

Vias are small openings in layers of the PCB that allow a conductive connection between different layers of the PCB. When sizes of the vias utilized by a differential pair are different, or a distance between the vias used by the differential pair does not comply with a predetermined criterion, the impedances of the differential pair may do not match, thus causing distortion and errors in the data transmitted by the differential pair.

Existing PCB wiring software does not alert a layout engineer of any improper vias in a wiring diagram. Thus, the layout engineer must check for this manually. It is time-consuming and troublesome for the layout engineer to do the check.

DETAILED DESCRIPTION

In general, the word "module," as used hereinafter, refers to logic embodied in hardware or firmware, or to a collection of software instructions, written in a programming language, such as, for example, Java, C, or assembly. One or more software instructions in the modules may be embedded in firmware. It will be appreciated that modules may comprise connected logic units, such as gates and flip-flops, and may comprise programmable units, such as programmable gate arrays or processors. The modules described herein may be implemented as either software and/or hardware modules and may be stored in any type of non-transitory computer-readable storage medium or other computer storage device.

Figure 1:
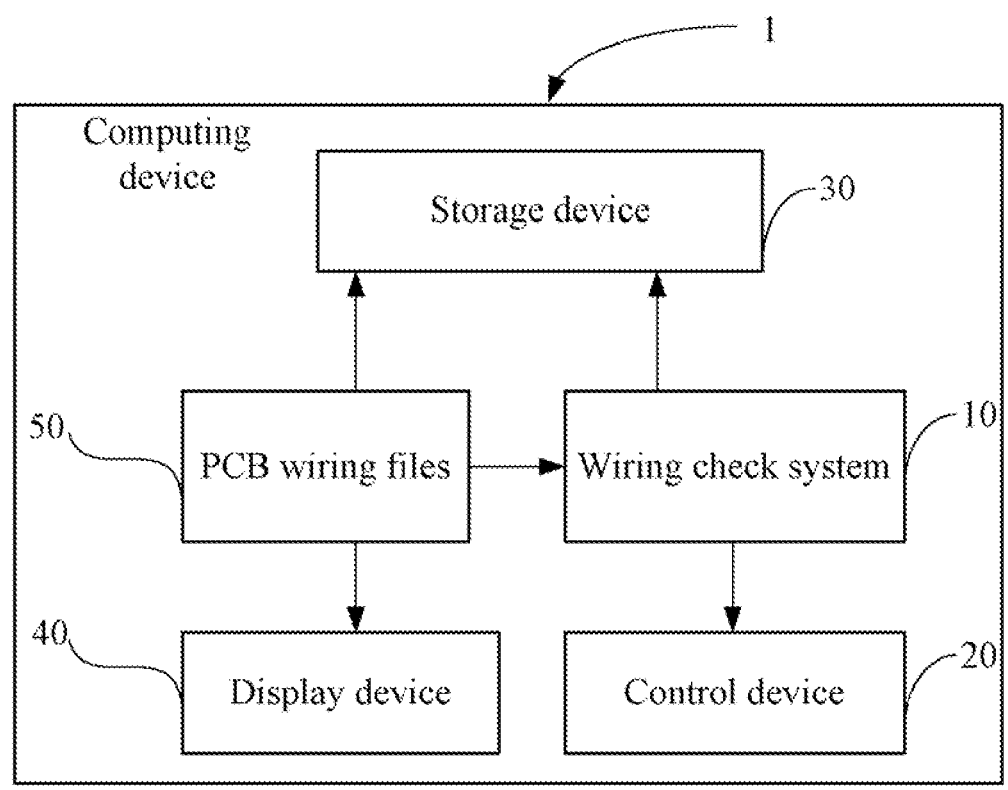
FIG. 1 is a block diagram of one embodiment of a computing device including a wiring check system.

FIG. 1 is a block diagram of one embodiment of a computing device 1 including a wiring check system 10. The computing device 1 may be a computer, a server, or a personal digital assistant (PDA), for example. The computing device 1 may further include components such as a control device 20, a storage device 30, and a display device 40. The computing device 1 may be configured in a number of other ways and may include other or different components.

Figure 2:
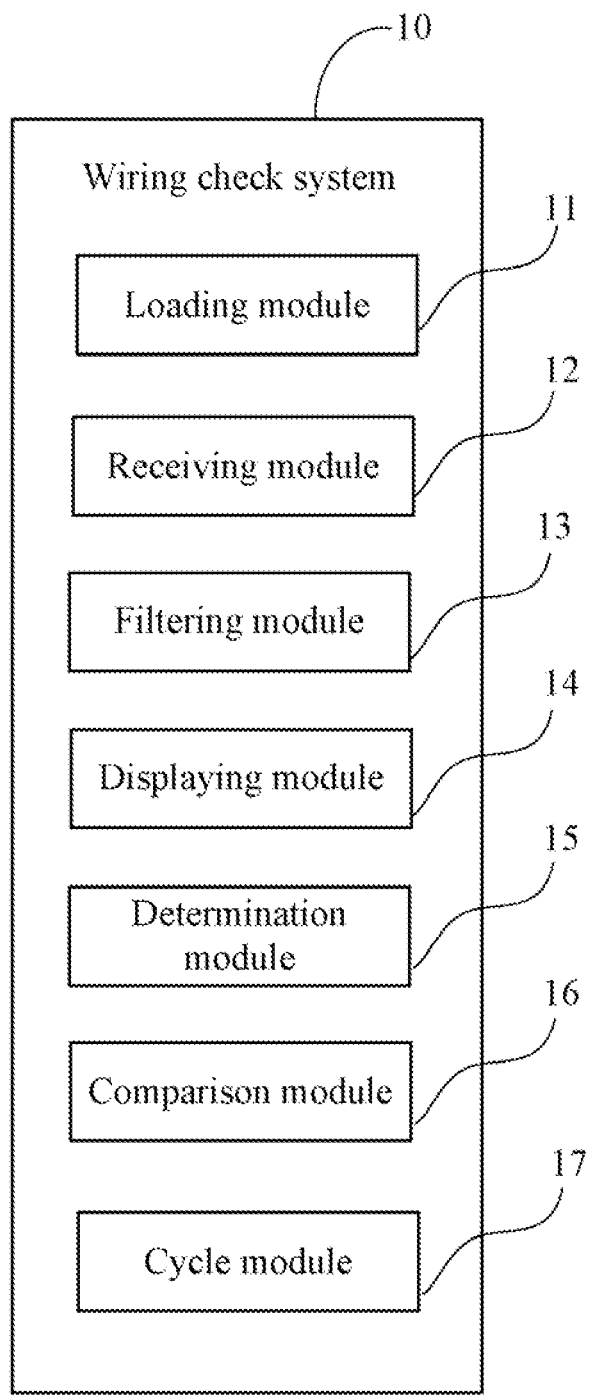
FIG. 2 is a block diagram of one embodiment of function modules of the wiring check system in FIG. 1.

The wiring check system 10 includes a number of function modules (depicted in FIG. 2). The function modules may include computerized codes in the form of one or more programs, which have functions of automatically checking whether there are any improper vias through which the differential pairs pass.

The control device 20 may be a processor, an application-specific integrated circuit (ASIC), or a field programmable gate array, (FPGA) for example. The control device 20 may execute the computerized codes of the function modules of the wiring check system 10 to realize the functions of the wiring check system 10.

The storage device 30 may include some type(s) of computer-readable non-transitory storage medium, such as a hard disk drive, a compact disc, a digital video disc, or a tape drive. The storage device 30 stores the computerized code of the function modules of the wiring check system 10 for execution by the control device 20.

The storage device 30 also stores one or more PCB wiring files 50, each of which includes a wiring diagram. Each of the wiring diagrams is a simplified conventional pictorial representation of an electrical circuit, in which multiple electrical components are connected together using transmission lines. The PCB wiring file 50 further includes basic information of each transmission line of the wiring diagram, such as an indication of whether a transmission line belongs to a differential pair, an index to another transmission line which also belongs to the same differential pair, one or more vias that the transmission line passes through, and further information. The PCB wiring file 50 further includes sizes and coordinates of the vias.

The display device 40 may include one or more output mechanisms, including a display, or a printer, for example, for displaying the wiring diagrams and outputting the results of checking the wiring diagrams.

FIG. 2 is a block diagram of one embodiment of function modules of the wiring check system 10. In one embodiment, the wiring check system 10 may include a loading module 11, a receiving module 12, a filtering module 13, a displaying module 14, a determination module 15, a comparison module 16, and a cycle module 17. The function modules 11 to 17 provide at least the functions needed to execute the steps illustrated in FIG. 3.

Figure 3:
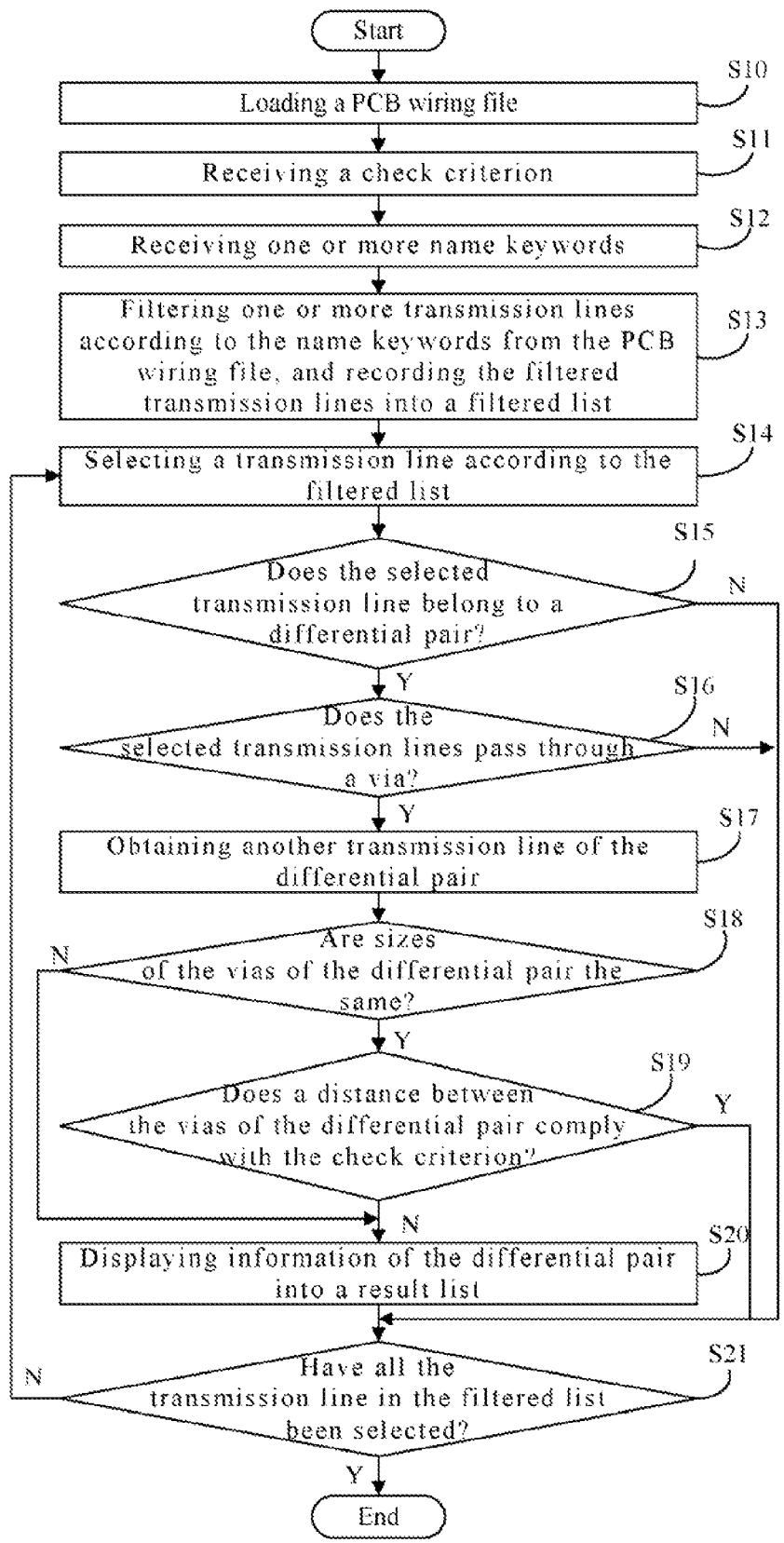
FIG. 3 illustrates a flowchart of one embodiment of a method for automatically checking wiring information.

FIG. 3 illustrates a flowchart of one embodiment of a method for automatically checking wiring information of a printed circuit board (PCB). Depending on the embodiment, additional steps in FIG. 3 may be added, others removed, and the ordering of the steps may be changed.

In step S10, the loading module 11 loads a PCB wiring file 50 from the storage device 30 of the computing device 1, and obtains the wiring diagram in the PCB wiring file 50.

In step S11, the receiving module 12 provides a user interface to apply a preset check criterion. The preset check criterion is determined according to the design requirements of the PCB, and is defined as a largest distance D between vias of a differential pair. In one embodiment, the distance D=30 mils.

In step S12, the receiving module 12 provides another user interface to receive one or more named keywords relating to transmission lines of the wiring diagram in the PCB wiring file 50. The named keyword may require a certain format, for example the characters "U*", where * represents any one or more characters, which indicate that an initial character of the name of a transmission line is U, such as U1, U2, and U3.

In step S13, the filtering module 13 filters one or more transmission lines from the PCB wiring file 50 according to the named keywords, and the displaying module 14 records the filtered transmission lines into a filtered list. The filtered list can be displayed on the display device 40.

In step S14, the receiving module 14 receives a selection of a transmission line from the filtered list. For example, the transmission line to be checked can be selected from the filtered list displayed on the display device 40.

In step S15, the determination module 15 determines whether or not the selected transmission line belongs to a differential pair according to the PCB wiring file 50. As mentioned above, the PCB wiring file 50 includes basic information of each transmission line of the wiring diagram, such as an indication of whether a transmission line belongs to a differential pair, and an index to any other transmission line which also belongs to the same differential pair. Step S16 is implemented when the selected transmission line belongs to a differential pair. Otherwise, step S21 is implemented when the selected transmission line does not belong to a differential pair.

In step S16, the determination module 15 further determines whether or not the selected transmission line passes through at least one via according to the PCB wiring file 50. As mentioned above, the PCB wiring file 50 records all the vias that each transmission line passes through. Step S17 is implemented when the selected transmission line passes through at least one via. Otherwise, step S21 is implemented when the selected transmission line does not pass through any via.

In step S17, the filtering module 13 obtains another transmission line of the same differential pair from the PCB wiring file 50 or from the filtered list.

In step S18, the comparison module 16 determines whether sizes of all the vias relevant to the differential pair are the same. Step S19 is implemented when the sizes of the vias for the differential pair are the same. Otherwise, step S20 is implemented when the sizes of the vias for the differential pair are different.

In step S19, the comparison module 16 determines whether a distance between the vias of the differential pair complies with the check criterion. Step S20 is implemented when the distance between the vias of the differential pair does not comply with the check criterion. Otherwise, step S21 is implemented when the distance between the vias of the differential pair does not comply with the check criterion.

In step S20, the displaying module 14 records and displays the results of the comparison in the form of a resulting list. In one embodiment, the information of the differential pair includes the sizes of the vias and the distance between the vias, and is included in the resulting list.

In step S21, the cycle module 17 determines whether all the transmission lines in the filtered list have been selected. Step S14 is repeated when any transmission line remains to be selected from filtered list. Otherwise, the procedure ends when all the transmission lines in the filtered list have been selected.

It should be emphasized that the above-described embodiments of the present disclosure, including any particular embodiments, are merely possible examples of implementations, set forth for a clear understanding of the principles of the disclosure. Many variations and modifications may be made to the above-described embodiment(s) of the disclosure without departing substantially from the spirit and principles of the disclosure. All such modifications and variations are intended to be included herein within the scope of this disclosure and protected by the following claims.

What is claimed is:

1. A computerized method for automatically checking wiring information, the method being executed by at least one processor of a computing device, and the method comprising:
   selecting a transmission line;
   determining whether or not the selected transmission line passes through at least one via when the selected transmission line belongs to a differential pair;
   obtaining another transmission line of the same differential pair when the selected transmission line passes through at least one via;
   determining whether sizes of vias for the differential pair are the same, and determining whether a distance between the vias for the differential pair complies with a check criterion;
   recording information of the differential pair into a resulting list when the sizes of the vias are different or the distance between the vias does not comply with the check criterion; and
   displaying the resulting list on a display unit of the computing device.

2. The method according to claim 1, wherein before the selecting step, the method further comprises:
   loading a PCB wiring file from a storage device of the computing device, and obtaining the wiring diagram in the PCB wiring file;
   receiving one or more named keywords relating to transmission lines;
   filtering one or more transmission lines from the PCB wiring file according to the named keywords; and
   recording the filtered transmission lines into a filtered list, wherein the selected transmission line is selected from the filtered list.

3. The method according to claim 2, wherein each of the named keywords has a format of U*, wherein * represents any one or more characters.

4. The method according to claim 1, wherein the PCB wiring file comprises an indication of whether a transmission line belongs to a differential pair, an index to any other transmission line which also belongs to the same differential pair, one or more vias through which the transmission line passes, and sizes and coordinates of the vias.

5. The method according to claim 1, wherein the information of the selected transmission line comprises the sizes of the vias and the distance between the vias, and is recorded into the resulting list.

6. A computing device, comprising:
   a display unit;
   a control device; and
   a storage device storing one or more programs which when executed by the control device, causes the control device to:
   select a transmission line;
   determine whether or not the selected transmission line passes through at least one via when the selected transmission line belongs to a differential pair;
   obtain another transmission line of the same differential pair when the selected transmission line passes through at least one via;
   determine whether sizes of vias for the differential pair are the same, and determine whether a distance between the vias for the differential pair complies with a check criterion;
   record information of the differential pair into a result list when the sizes of the vias are different or the distance between the vias does not comply with the check criterion; and display the resulting list on the display unit of the computing device.

7. The computing device according to claim 6, before the selecting step, the control device further to:
load a PCB wiring file from the storage device of the computing device, and obtain the wiring diagram in the PCB wiring file;
receive one or more named keywords relating to transmission lines;
filter one or more transmission lines from the PCB wiring file according to the named keywords; and
record the filtered transmission lines into a filtered list, wherein the selected transmission line is selected from the filtered list.

8. The computing device according to claim 7, wherein each of the named keywords has a format of U*, wherein * represents any one or more characters.

9. The computing device according to claim 6, wherein the PCB wiring file comprises an indication of whether a transmission line belong to a differential pair, an index to any other transmission line which also belongs to the same differential pair, one or more vias through which the transmission line passes, and sizes and coordinates of the vias.

10. The computing device according to claim 6, wherein the information of the selected transmission line comprises the sizes of the vias and the distance between the vias, and is recorded into the result list.

11. A non-transitory storage medium having stored thereon instructions that, when executed by a processor of a computing device, causes the processor to perform a method for automatically checking wiring information, wherein the method comprises:
selecting a transmission line;
determining whether or not the selected transmission line passes through at least one via when the selected transmission line belongs to a differential pair;
obtaining another transmission line of the same differential pair when the selected transmission line passes through at least one via;
determining whether sizes of vias for the differential pair are the same, and determining whether a distance between the vias for the differential pair complies with a check criterion;
recording information of the differential pair into a resulting list when the sizes of the vias are different or the distance between the vias does not comply with the check criterion; and
displaying the resulting list on a display unit of the computing device.

12. The non-transitory storage medium according to claim 11, wherein before the selecting step, the method further comprises:
loading a PCB wiring file from a storage device of the computing device, and obtaining the wiring diagram in the PCB wiring file;
receiving one or more named keywords relating to transmission lines;
filtering one or more transmission lines from the PCB wiring file according to the named keywords; and
recording the filtered transmission lines into a filtered list, wherein the selected transmission line is selected from the filtered list.

13. The non-transitory storage medium according to claim 12, wherein each of the named keywords has a format of U*, wherein * represents any one or more characters.

14. The non-transitory storage medium according to claim 11, wherein the PCB wiring file comprises an indication of whether a transmission line belongs to a differential pair, an index to any other transmission line which also belongs to the same differential pair, one or more vias through which the transmission line passes, and sizes and coordinates of the vias.

15. The non-transitory storage medium according to claim 11, wherein the information of the selected transmission line comprises the sizes of the vias and the distance between the vias, and is recorded into the resulting list.

* * * * *